(12) United States Patent
Ooae et al.

(10) Patent No.: US 6,252,344 B1
(45) Date of Patent: Jun. 26, 2001

(54) ELECTRON GUN USED IN AN ELECTRON BEAM EXPOSURE APPARATUS

(75) Inventors: Yoshihisa Ooae; Takamasa Satoh; Akio Yamada; Hiroshi Yasuda, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/335,398

(22) Filed: Jun. 17, 1999

(30) Foreign Application Priority Data

Jun. 18, 1998 (JP) .................................................. 10-171770

(51) Int. Cl.⁷ ...................................................... H01J 29/76
(52) U.S. Cl. ..................... 313/413; 313/336; 250/492.23; 250/423 F; 250/346 R; 250/492.2
(58) Field of Search ..................................... 313/306, 307, 313/308, 309, 336, 414, 413, 448; 250/492.23, 423 F

(56) References Cited

U.S. PATENT DOCUMENTS

| 4,200,555 | 4/1980 | Joy et al. | 252/521 |
| 4,528,474 | 7/1985 | Kim | 313/346 R |
| 5,155,412 | 10/1992 | Chang et al. | 315/14 |
| 5,449,968 | 9/1995 | Terui et al. | 313/362.1 |
| 5,854,490 | * 12/1998 | Ooaeh et al. | 250/492.23 |

* cited by examiner

*Primary Examiner*—Vip Patel
*Assistant Examiner*—Ken A Berck
(74) *Attorney, Agent, or Firm*—Christie, Parker & Hale, LLP

(57) ABSTRACT

An electron gun, preferably a four-pole electron gun, used in an electron beam exposure apparatus is formed by: a cathode for emitting an electron beam when supplying a negative and high-accelerated voltage; a first grid provided downstream of the cathode for focusing a crossover image of the electron beam when supplying a voltage which becomes a reverse bias for the cathode, and the cathode and the first grid being arranged at a high voltage side of a high voltage insulator; an anode for collecting the electron beam which passes through the first grid, and being arranged at a low voltage side of the high voltage insulator; and a second grid provided at the high voltage side of the high voltage insulator and between the first grid and the anode, and having an aperture for limiting an amount of the electron beam passing therethrough. A voltage which becomes a forward bias for the cathode is supplied to the second grid, and the crossover image is focused at the aperture of the second grid.

7 Claims, 7 Drawing Sheets

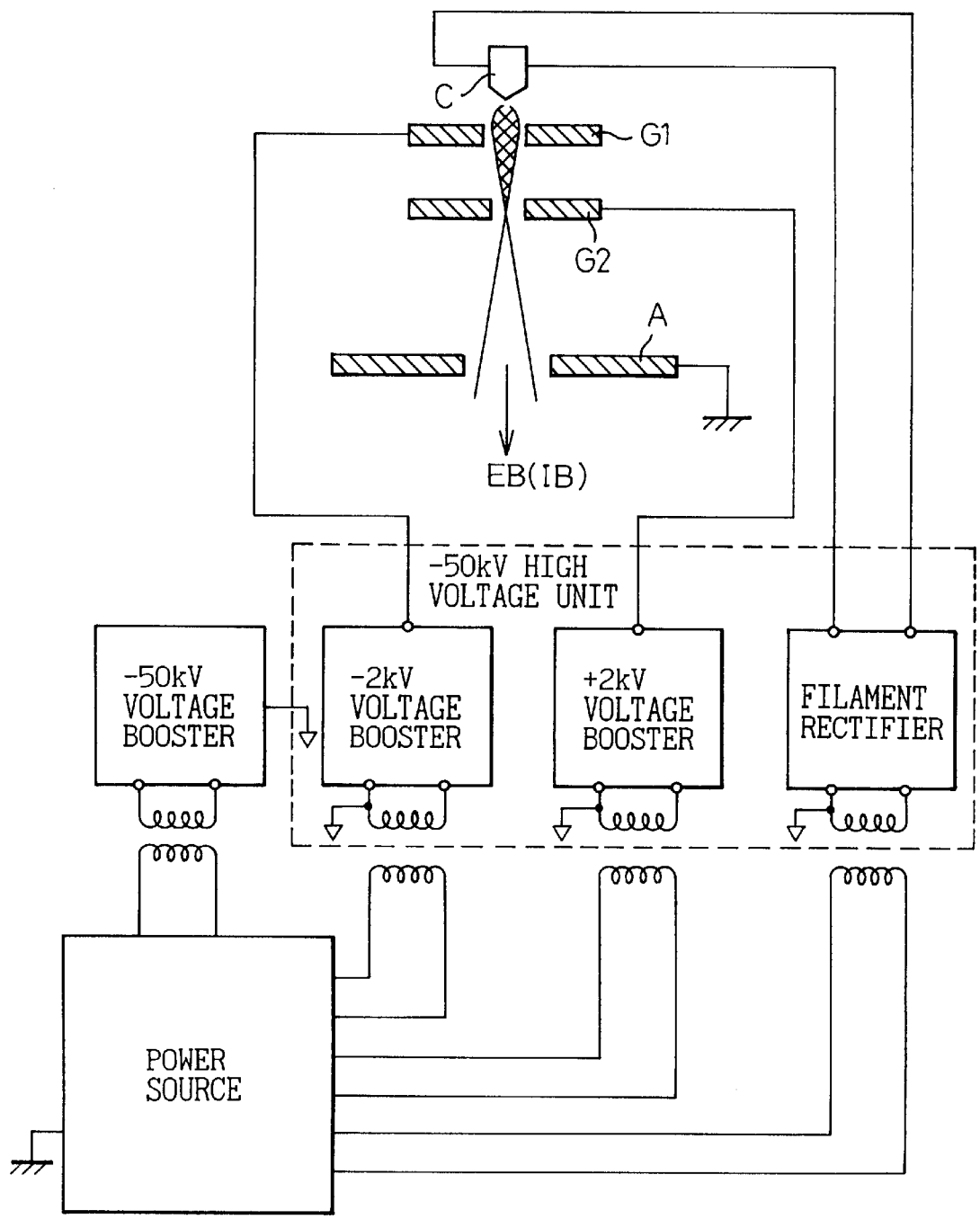

ELECTRON GUN USED IN AN ELECTRON BEAM EXPOSURE APPARATUS

BACKGROUND OF THE INVENTION

1. Field of the Invention

The present invention relates to an exposure apparatus using a charged particle beam such as an electron beam. In particular, it relates to an electron gun for generating the electron beam used for drawing predetermined patterns on a material to be exposed (particularly, a wafer) in an electron beam exposure apparatus.

2. Description of the Related Art

Conventionally, there are many known electron beam exposure apparatuses, for example, a variable rectangular exposure apparatus, a block exposure apparatus, and a blanking aperture array (BAA) exposure apparatus. In these exposure apparatuses, there is a mask or block mask having a rectangular aperture in order to form a cross-sectional shape of the electron beam, art aperture having an optional shape used as a unit of repeating figure, and a plurality of apertures arranged in matrix. The electron beam is formed by irradiating a desired area of the aperture on the mask so that a desired pattern is drawn on the wafer.

In this case, the uniformity of the electron beam irradiated to the wafer has a large influence to a line width of the pattern to be drawn. For example, when it is assumed that an allowable line width is 0.01 μm when drawing a line having a width of 0.1 μm, the uniformity of beam irradiation is allowed for fluctuation of only a few percent. As a result, an irradiation area which appears to be uniform becomes narrow, and an exposure area is reduced so that the throughput of the electron beam exposure apparatus deteriorates.

SUMMARY OF THE INVENTION

The object of the present invention is to provide an improved electron gun used in an electron beam exposure apparatus.

In accordance with the present invention, there is provided an electron gun and, in preferred embodiment, a four-pole electron gun, used in an electron beam exposure apparatus, including: a cathode for emitting an electron beam when a negative and high-accelerated voltage is supplied; a first grid provided at a downstream of the cathode for focusing a crossover image of the electron beam when supplying a voltage which becomes a reverse bias for the cathode, and the cathode and the first grid being arranged at a high voltage side of a high voltage insulator; an anode, for collecting the electron beam which passes through the first grid, arranged at a low voltage side of the high voltage insulator; and a second grid, provided at the high voltage side of the high voltage insulator and between the first grid and the anode, having an aperture for limiting an amount of the electron beam passing therethrough; wherein a voltage which becomes a forward bias for the cathode is supplied to the second grid, and the crossover image is focused at the aperture of the second grid.

In another preferred embodiment, the electron gun further includes an electromagnetic deflector for deflecting the electron beam emitted from the cathode toward the aperture of the second grid, wherein the electromagnetic deflector is arranged at a location insulated from the cathode and the first/second grids by the high voltage insulator, and is arranged at the location approximately corresponding to the location of the cathode for the direction of the electron beam.

In still another preferred embodiment, the electron gun further includes a difference detecting circuit for calculating a current (IB) passing through the aperture of the second grid based on a difference between an emission current (IE) emitted from the cathode and the current (IG2) inputting to the second grid, and for controlling at least one of the supply voltages (VG1, VG2) for the first and second grids (G1, G2) as the calculated current (IB) is kept constant.

In still another preferred embodiment, at least one of the supply voltages (VG1, VG2) for the first and second grids (G1, G2) is controlled as the emission current (IE) from the cathode is kept constant.

In still another preferred embodiment, at least one of the supply voltages (VG1, VG2) for the first and second grids (G1, G2) is controlled as the current (IG2) input to the second grid is kept constant.

In still another preferred embodiment, each of the supply voltages (VG1, VG2) for the first and second grids (G1, G2) is determined as a ratio (IB/IE) of the current passing through the aperture of the second grid and the emission current (IE) emitted from the cathode becomes maximum.

BRIEF DESCRIPTION OF THE DRAWINGS

FIG. 4 is a schematic electrical-block diagram of an electron beam exposure apparatus using the four-pole electron gun according to the present invention.

DESCRIPTION OF THE PREFERRED EMBODIMENTS

Figure 1:
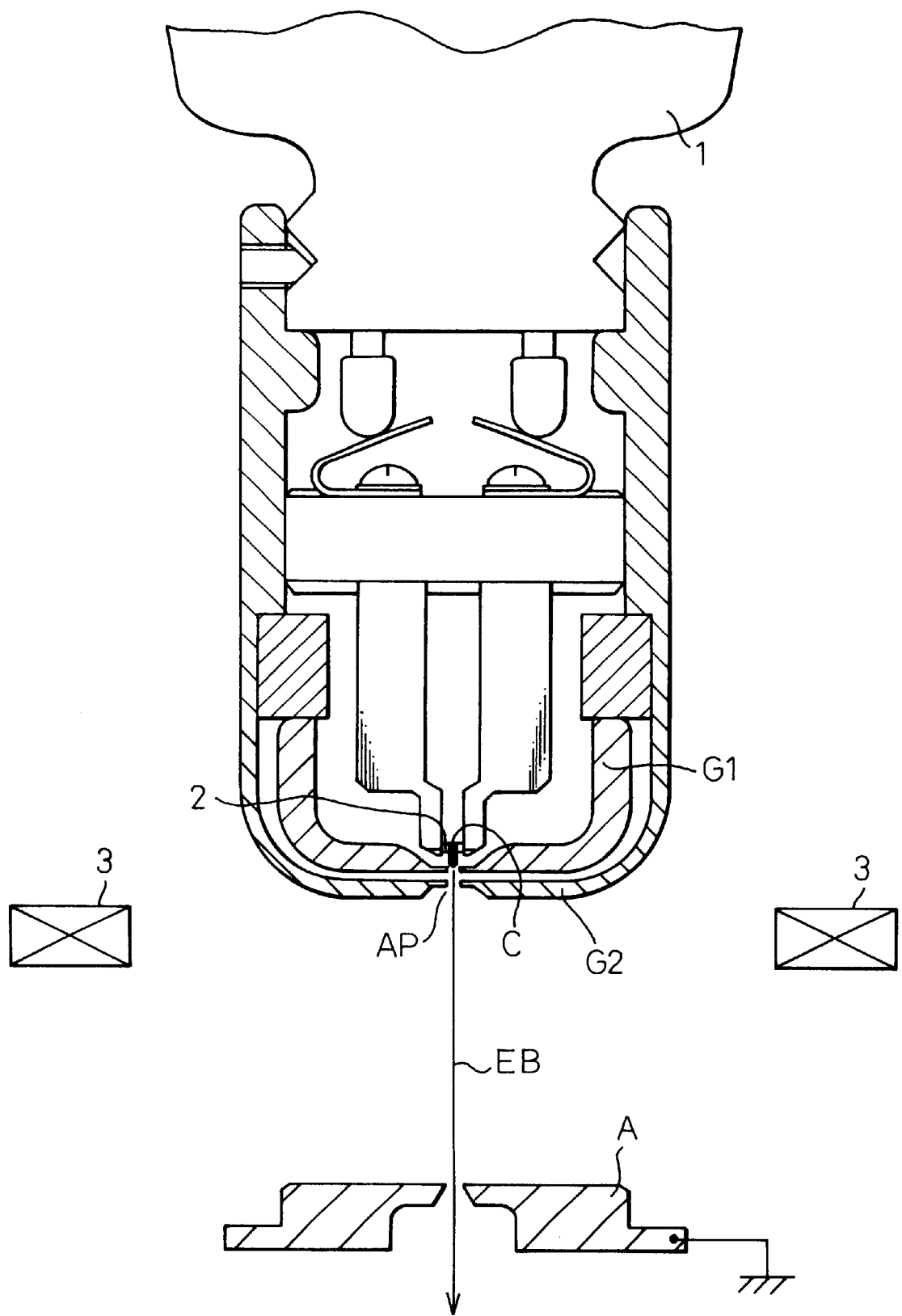
FIG. 1 is a schematic cross-sectional view of a four-pole electron gun according to an embodiment of the present invention.

Before explaining of the preferred embodiments according to the present invention, some examples of the conventional art and their problems will be explained in detail with reference to the drawing.

Figure 6:
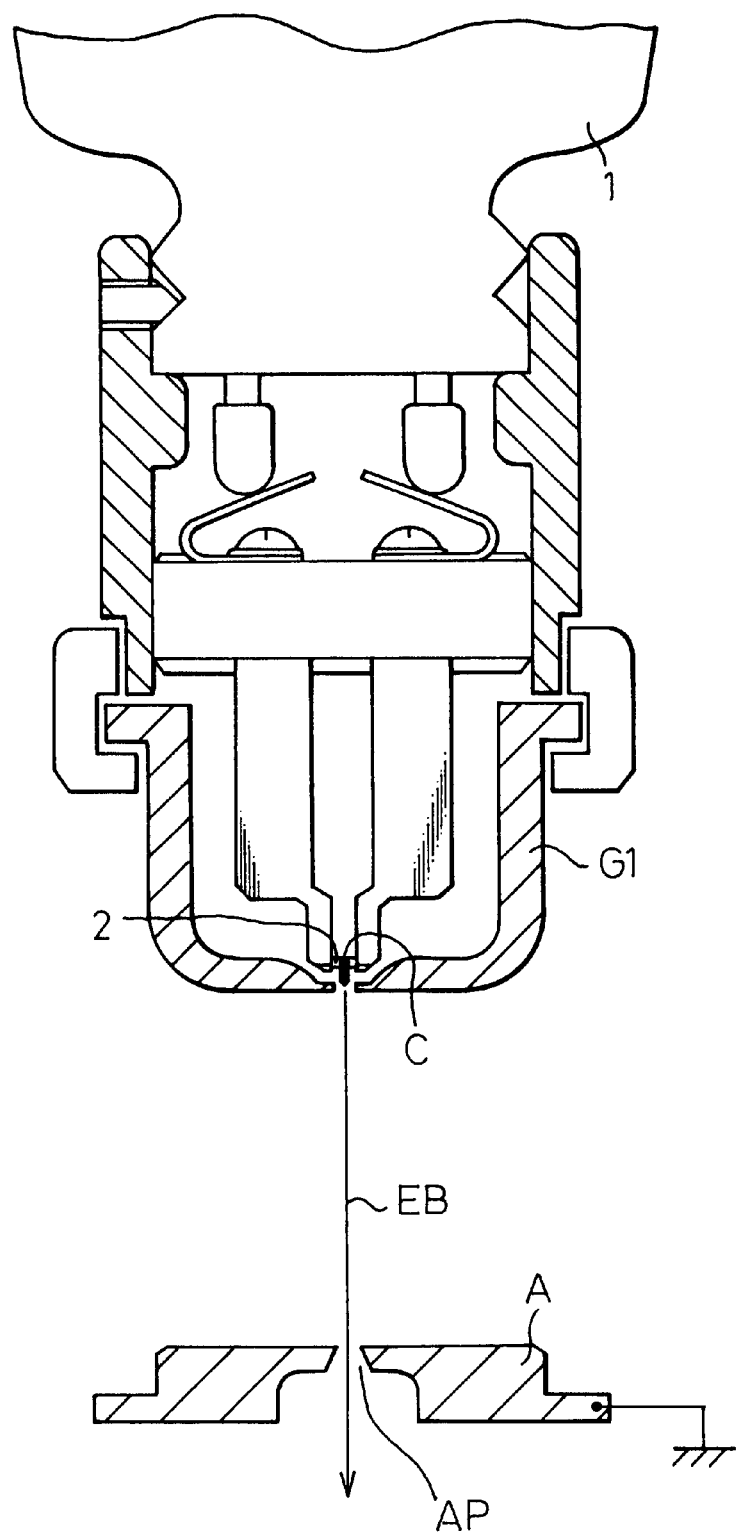
FIG. 6 is a schematic cross-sectional view of a three-pole electron gun in a conventional art.

FIG. 6 is the schematic cross-sectional view of the three-pole electron gun in the conventional art. In the drawing, reference number 1 is a high voltage insulator, 2 is a heater, C is a cathode, G1 is a grid, and A is an anode having an aperture AP. The high voltage insulator 1 is provided for insulating each of the electrodes, and the heater 2 is provided for heating the cathode C. The conventional three-pole electron gun is formed by the cathode C, the grid G1 and the anode A. The detail explanations are given in the following FIG. 7.

Figure 7:
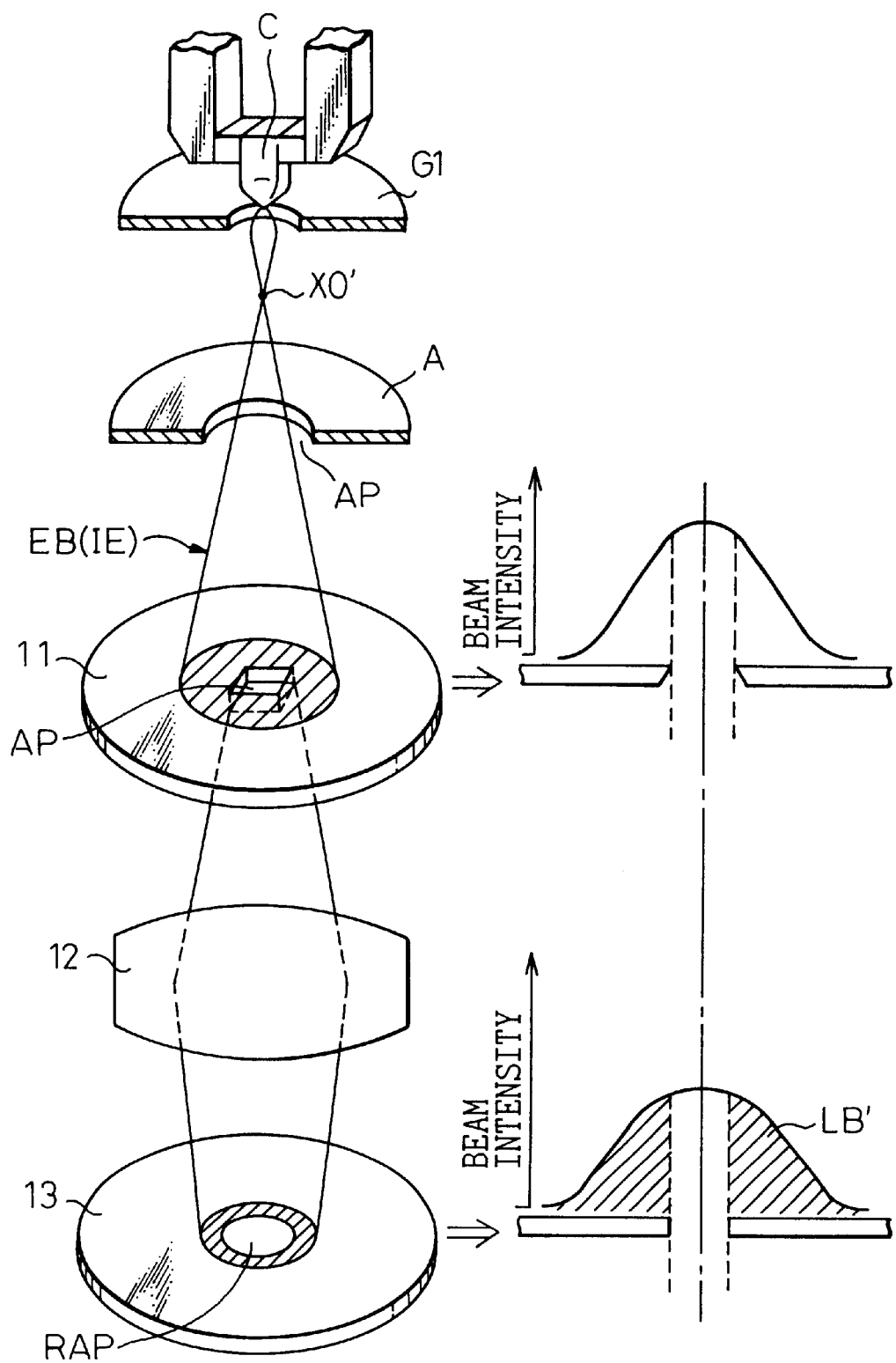
FIG. 7 is a view for explaining an electron beam and the beam intensity in an electron beam exposure apparatus having the three-pole electron gun shown in FIG. 6.

FIG. 7 is a view for explaining an electron beam and the beam intensity in the electron beam exposure apparatus having the three-pole electron gun shown in FIG. 6. The same structural components used in FIG. 6 are attached to the same reference numbers in the following drawings. The cathode C is provided for emitting thermal electrons (in other words, an emission current IE, i.e., an electron beam EB) by supplying a negative and high-accelerated voltage.

The grid G1 is provided for focusing a crossover image XO' of the electron beam EB by supplying a voltage which becomes a reverse bias for the cathode C. The anode A is provided for collecting the accelerated electron beam EB after passing through the grid G1. Further, the cathode C and the grid G1 are arranged at a high voltage side of the high voltage insulator 1, and the anode A is arranged at a low voltage side of the high voltage insulator 1 (In general, the anode A is connected to a ground as shown in FIG. 1.).

Still further, reference number 11 is a first mask which has a rectangular aperture AP or slit and which is arranged downstream of the anode A. Reference number 12 is a lens unit including a block mask in which an aperture of the patterns to be drawn is formed, an electron lens (not shown) for collecting the electron beam, a deflector (not shown) for deflecting the electron beam, and a coil (not shown) for correcting the electron beam. Reference number 13 is a second mask, having a round aperture RAP, arranged at the downstream of the lens unit 12.

In the above structure, the emission current IE (i.e., the electron beam EB) emitted from the cathode C forms the crossover image XO' due to an electric field made by the grid G1, and passes through the aperture AP of the anode A. Further, the electron beam EB is irradiated on the first mask 11 having the rectangular aperture AP. In this case, a part of the electron beam EB irradiated on the first mask 11 is cut off by the surrounding area of the rectangular aperture AP (see an area shown by slanted lines), and the remaining electron beam EB passes through the rectangular aperture AP. The electron beam EB passed through the rectangular aperture AP is collected by the lens unit 12 including the electron lens, the deflector and the coil.

Still further, the electron beam EB is irradiated on the second mask 13 having the round aperture RAP. The electron beam passed through the round aperture RAP is deflected by a main-deflector and a sub-deflector (both not shown), and exposed on a desired location on the wafer. As a result, predetermined patterns are drawn on the wafer.

On the other hand, there is another type electron gun, i.e., an aperture-cut electron gun (not shown). The aperture-cut electron gun basically has the same structure as the three-pole electron gun, but a second grid having an aperture is provided between the grid (i.e., Wehnelt grid) and the anode. In a conventional aperture-cut electron gun, the Wehnelt grid is arranged at the high voltage side of the high voltage insulator, and the second grid is arranged at the low voltage side of the insulator (In general, the second grid is connected to the ground).

The following explanations are given of problems of the conventional three-pole electron gun and the aperture-cut electron gun.

First, problems of the conventional three-pole electron gun will be explained below.

In the conventional three-pole electron gun shown in FIGS. 6 and 7, the emission current IE passes through the aperture AP of the anode A so that a thermal load which is applied to the first mask 11 becomes relatively large. As a result of large thermal load, there are the following problems, i.e., melting of the area surrounding the rectangular aperture Ap on the first mask 11, occurrence of cracks on the area surrounding the rectangular aperture AP, and breaking away of a metal coating film. Further, in the lens unit 12 arranged downstream of the first mask 11, since the energy applied to the area surrounding (i.e., a beam cutting portion) the rectangular aperture in the block mask is relatively large, there are the same problems mentioned above, i.e., damage to the beam cutting portion and melting of that portion. Still further, on the second mask 13 having the round aperture RAP which is arranged downstream of the lens unit 12, there is a problem in which much of the electron beam is wasted on the surrounding area as shown by slanted lines LB' in FIG. 7.

Further, in the conventional three-pole electron gun, the uniformity of the electron beam irradiated to the wafer can be improved by enlarging the emission current IE. However, since the energy applied to the beam cutting portion in the block mask becomes large in accordance with increase of the emission current IE, there are problems, i.e., damage to the beam cutting portion and melting of that portion, so that it is very difficult to realize uniformity of the electron beam irradiated to the wafer.

Still further, in the typical three-pole electron gun, the temperature of a chip, which is used for the cathode and made of $LaB_6$ monocrystal, is increased to the vicinity of 1500° when the chip is heated by the heater. Accordingly, a material to hold the heated cathode must be proof against high temperature and thermally insulated, and it is necessary to be electrically insulated from the surrounding area in order to provide the heating current. As a result, an improved structure must be considered when assembling the heater and the cathode, and it is very difficult to determine the location of the end of the chip (i.e., a beam emitting portion) with high precision.

In particular, emission conditions of the electron beam must be considerably changed in accordance with the relative location of the Wehnelt grid so that it is very difficult to rearrange the location of the end of the chip when assembling the same, and crossover conditions are also changed. Accordingly, there is a problem in which the mounting precision is largely influenced in the conventional three-pole electron gun.

In this case, an actual size of the end of the chip is approximately several tens of $\mu$m in diameter, and an actual size of the aperture of the Welnelt grid is approximately 1 mm in diameter. As is obvious from the above, since the size of the end of the chip and the size of the aperture are very small, very small areas must be located in a positioning process. Accordingly, even if a slight difference occurs in the positioning process, this difference has a large influence on the emitted electron beam. In these situations, there are various essential conditions in the electron beam emitted from the three-pole electron gun so that it is very difficult to simultaneously satisfy these conditions based on the three parameters (1) to (3). The essential conditions to be satisfied are as follows, (1) an amount of the emission current IE (This current causes the damage to the area surrounding the rectangular aperture on the first mask 11), (2) a uniformity of beam irradiation, and (3) a size of crossover image (a size of the crossover image on the round aperture on the mask 1).

Further, in a three-pole electron gun, since each voltage applied to the cathode electrode and the anode electrode is fixed, the electrode on which the voltage can be changed freely is only the grid electrode (i.e., the Welnelt grid). Accordingly, it is basically impossible to simultaneously satisfy the above three conditions by using one parameter (i.e., change of voltage of the grid). In the conventional art, each structural part must be designed with very high precision (i.e., with an approximately ideal state based on calculation and experiment), and the supply voltage to the grid electrode is controlled so that the emission current IE becomes a predetermined value. In this case, the conditions in the above items (2) and (3) are changed in accordance with change of the voltage to the grid.

In other words, in the conventional art, when any one condition in items (1) to (3) is satisfied with high precision, other conditions are different from the ideal state in accordance with various differences due to mounting precision of the parts and due to parts manufacturing precision. Further, there is a large problem in which the crossover image becomes large. When irradiating the electron beam on each mask, and when an amount of the electron beam which is cut off by the round aperture RAP on the second mask 13 becomes large, the second mask 13 is irradiated by unnecessary beam (see slanted lines LB' in FIG. 7).

For example, when a ratio of the current which is cut off by the round aperture RAP and the current passing through the round aperture RAp is one-to-one (1:1), this means that there is double unnecessary beam irradiation on the second mask 13. Accordingly, for example, a beam irradiation of about 60 A/cm$^2$ is needed to realize a current density of, for example, 30 A/cm$^2$ on the wafer. As a result, there is a problem of melting of the surrounding area due to the large current as mentioned above.

Second, problems of a conventional aperture-cut electron gun will be explained below.

In the conventional aperture-cut electron gun, the first grid (i.e., Welnelt grid) is arranged at the high voltage side of the high voltage insulator, and the second grid is arranged at the low voltage side (i.e., ground side) of the high voltage insulator. Accordingly, there are the following problems in this structure.

First, since a part of electron beam which is finally accelerated, is cut off by the round aperture RAP, energy load is increased at the round aperture RAP. As a result, there are problems of melting of the area surrounding the round aperture RAP and occurrence of cracks without melting of the surrounding area. Further, since the crossover image which is provided just under the electron gun must be re-focused by using the lens, it is necessary to provide an electron gun having relatively large size.

Still further, since the light path of the electron beam becomes long so that the crossover image is focused twice, there is a problem in which aberration due to a coulomb mutual force is increased. Still further, although it is considered that the negative voltage is applied in order to reduce the energy load at the round aperture RAP, in this case, however, it is necessary to use a particular insulator having an insulation level similar to that of the cathode so that the size of the electron gun also becomes large.

The present invention aims to solve the above-mentioned various conventional problems, i.e., problems of melting of the surrounding area, of the damage at the rectangular aperture and the surrounding area thereof, etc., and to provide an improved electron gun as explained in detail below.

In the structure of the electron gun according to the present invention, the crossover image is focused at the aperture of the second grid (i.e., the aperture of the second grid is aligned with the crossover image.). Even if the emission current (i.e., electron beam emitted from the cathode) becomes large, an unnecessary skirt portion of the electron beam having a Gaussian distribution characteristic is cut off so that it is possible to control an amount of the electron beam on each mask downstream of the aperture.

That is, according to the present invention, it is possible to relatively reduce the thermal energy on the area surrounding the aperture and the round aperture. As a result, it is possible to suppress the damage to the aperture so that it is possible to solve the problem of the melting of the area surrounding the aperture.

Further, in the structure of the electron gun according to the present invention, the electro-magnetic deflector is provided for deflecting the electron beam emitted from the cathode toward the aperture of the second grid. In this case, it is desirable to provide the electromagnetic deflector at the location which is insulated from the cathode and first/second grids through the high voltage insulator, and is at approximately the same location as the cathode for the irradiated direction of the electron beam.

According to the electromagnetic deflector according to the present invention, it is possible to easily deflect the electron beam emitted from the cathode to the aperture of the second grid, and to align the end of the cathode with the aperture of the second grid with mechanically high precision.

The preferred embodiments according to the present invention will be explained in detail with reference to the attached drawings.

Figure 2:
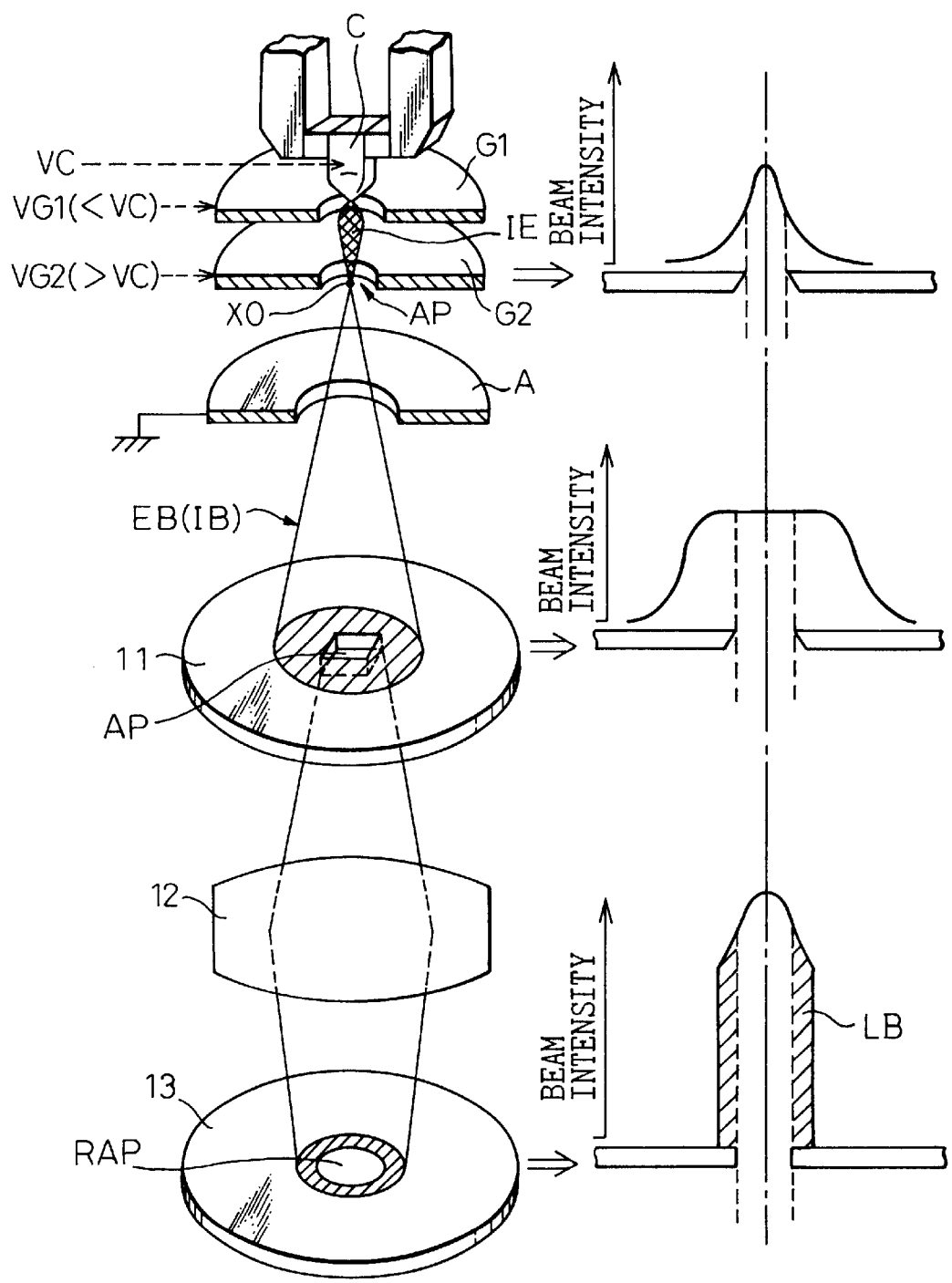
FIG. 2 is a view for explaining the electron beam and the beam intensity in an electron beam exposure apparatus having the four-pole electron gun shown in FIG. 1.

FIG. 1 is a schematic cross-sectional view of a four-pole electron gun according to one embodiment of the present invention, and FIG. 2 is a view explaining the electron beam and the beam intensity in an electron beam exposure apparatus having the four-pole electron gun shown in FIG. 1. In FIGS. 1 to 5, reference number G2 is a second grid according to the present invention. The four-pole electron gun according to the present invention is formed by the cathode C, the first grid G1, the second grid G2 and the anode A.

In FIGS. 1 and 2, as well as the structure shown in FIG. 7, the cathode C is provided for emitting the emission current IE or electron beam EB, the grid G1 is provided for focusing the crossover image of the electron beam EB, and the anode A is provided for collecting the accelerated electron beam EB. Further, the second grid G2 according to the present invention, having the aperture AP, is provided between the first grid G1 and the anode A.

Further, as well as the structure shown in FIG. 7, the first mask 11 has the rectangular aperture AP or slit and is arranged downstream of the anode A. The lens unit 12 includes the block mask in which the aperture of the patterns to be drawn is formed, the electron lens for collecting the electron beam, the deflector for deflecting the electron beam, and the coil for correcting the electron beam. Still further, the second mask 13 has the round aperture RAP and is arranged downstream of the lens unit 12.

First the structural features of the present invention are illustrated by the following four points.

1. The second grid G2 is arranged between the first grid G1 and the anode A, and includes the aperture AP for limiting the passing amount of the electron beam.

2. The second grid G2 is also arranged at the high voltage side of the high voltage insulator (see number 1 in FIG. 1), as well as the cathode C and the first grid G1. This means that, in the present invention, the cathode, the first grid and the second grid are arranged at the high voltage side of the high voltage insulator.

3. When a negative and high-accelerated voltage VC is supplied to the cathode C, a voltage VG2 (>VC) which is set to a forward bias for the voltage VC is supplied to the second grid G2.

4. The crossover image XO is focused at the aperture AP of the second grid G2 (see FIG. 2).

In this embodiment, a diameter of the end of the cathode C is set to, for example, several tens of μm, and the diameter of the aperture Ap of the second grid G2 is set to, for example, 60 μm.

The second structural feature of the present invention is to provide an electro-magnetic deflector 3 (See FIG. 1 which shows a cross-sectional view of a ring-like deflector.) in order to deflect the electron beam emitted from the cathode C toward the aperture AP of the second grid G2. The electro-magnetic deflector 3 is arranged at the location insulated from the cathode C, the first grid G1 and the second grid G2, through the high voltage insulator 1. Further, the deflector 3 is arranged at an approximately similar location to the cathode C for the direction of the electron beam.

In FIG. 1, as mentioned above, the heater 2 is provided for heating the cathode C. in FIG. 2, IB denotes the current passing through the aperture AP of the second grid G2. In this case, the voltage VG1 (<VC) which is set to a reverse bias for the voltage VC is supplied to the first grid G1. The anode A is connected to the ground which is common to the side of the low voltage of the high voltage insulator 1.

In the above structure of the present invention, the emission current IE emitted from the cathode C of the four-pole electron gun forms the crossover image XO at the aperture AP of the second grid G2 based on the electro-magnetic field which is determined by the supply voltage VG1 for the first grid G1 and the supply voltage VG2 for the second grid G2. At that time, since the diameter of the aperture AP is 60 μm which is relatively small, when the irradiated electron beam has a Gaussian distribution, the skirt portion (i.e., bottom portion of Gaussian distribution) of the irradiated electron beam is cut off.

The electron beam passing through the aperture AP of the second grid G2 is accelerated toward the anode A, and irradiated on the first mask 11 having the rectangular aperture AP after passing through the aperture AP of the anode A. Further, the electron beam passing through the rectangular aperture AP of the first mask 11 is irradiated to the lens unit 12. In the lens unit 12, the electron beam is collected by the lens, deflected by the deflector, and corrected by the coil, as shown in FIG. 7.

After passing through the lens unit 12, the electron beam EB is irradiated on the second mask 13 having the round aperture RAP. After passing through the round aperture RAP, the electron beam EB is exposed on the desired location on the wafer after being deflected by the main and sub-deflectors.

According to this embodiment, even if the emission current IE becomes large, since unnecessary skirt portion of the electron beam having the Gaussian distribution is cut off due to action of the second grid G2, it is possible to suppress an amount of the electron beam to be irradiated on the first mask 11 compared to the conventional three-pole electron gun. That is, according to the present invention, it is possible to reduce the thermal energy applied to the area surrounding the rectangular aperture AP (this is called "a beam cut-off portion") on the mask 11. As a result, it is possible to eliminate the damage to the beam cut-off portion and to solve the conventional problem, i.e., melting of the surrounding area.

Further, since the emission current IE emitted from the cathode C can be set to a large value, there is an advantage in which it is possible to improve the uniformity of electron beam irradiated to the first mask 11 having the rectangular aperture.

Still further, when the crossover image is projected on the second mask 13 having the round aperture RAP, as shown by the graph of the second mask 13 in FIG. 2, the electron beam forming the crossover image is shown by the Gaussian distribution which has no skirt portion. In this case, although there is a partial electron beam which is cut off by the area surrounding the round aperture RAP (i.e., slanted lines LB), in actuality, since the beam diameter can be adjusted based on the size of the aperture AP of the second grid G2, it is possible to eliminate the unnecessary beam LB which is cut off on the second mask 13.

As mentioned in the conventional problem, when mounting each electrode to the electron gun, it is very difficult in actuality to mechanically mount and align the aperture AP of the second grid G2 having a diameter of 60 μm to the end of the cathode of several tens of μm, with high precision.

On the other hand, since the electro-magnetic deflector 3 is provided in the present invention, it is possible to deflect the electron beam which is emitted from the cathode C toward the aperture AP of the second grid G2, by adjusting the electromagnetic field. As a result, it is possible to correct a mechanical error (for example, an error of alignment).

Figure 3A:
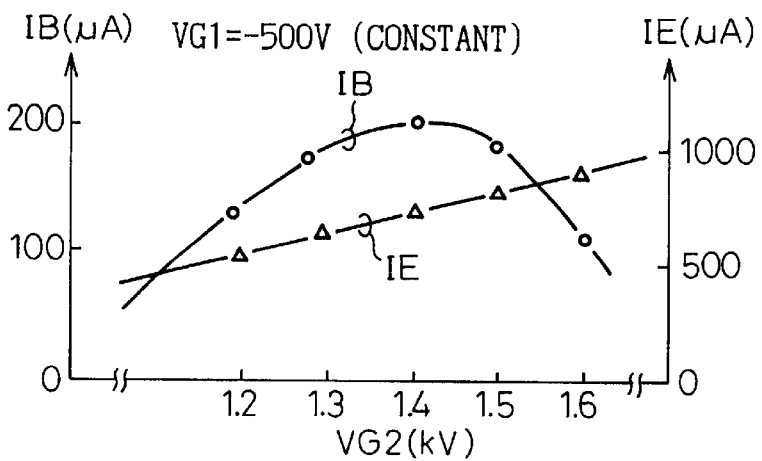
FIGS. 3A to 3C are views for explaining the electrical and physical characteristics of the four-pole electron gun according to the present invention.
Figure 3B:
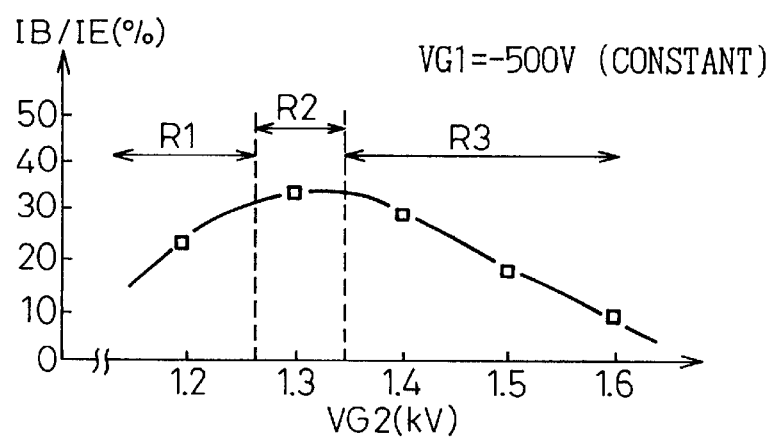
Figure 3C:
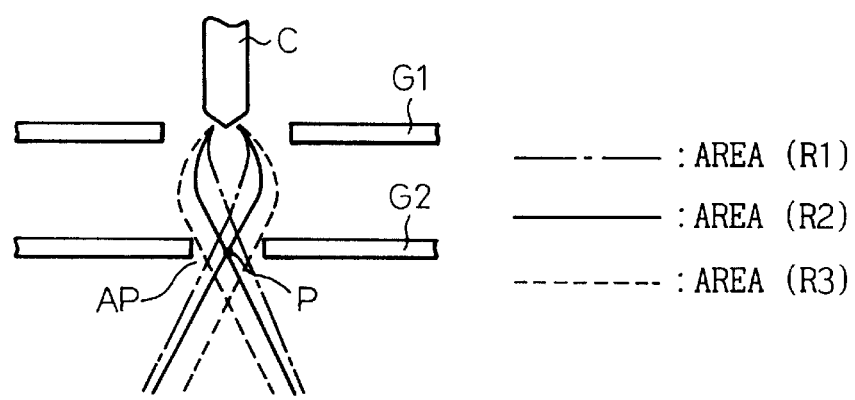

FIGS. 3A to 3C are views for explaining the electrical and physical characteristics of the four-pole electron gun according to the present invention. In FIG. 3A, this graph shows the case where the supply voltage VG1 for the first grid G1 is set to the constant negative voltage (i.e., VG1=−500V), and the supply voltage VG2 for the second grid G2 is changed. The current IB passing through the aperture AP of the second grid G2 and the emission current IE emitted from the cathode C are changed in accordance with change of the second voltage VG2. In FIG. 3B, this graph shows the case where the supply voltage VG1 is constant. When the supply voltage VG2 is changed, the change of ratio of IB and IE (i.e., IB/IE) is shown in an ordinate of the graph. In FIG. 3C, R1, R2 and R3 are areas of the supply voltage VG2 in FIG. 3B. When the supply voltage VG2 is changed, configuration of the electron beam emitted from the cathode C is also changed in the second grid G2 as shown in FIG. 3C.

As shown in FIG. 3A, the emission current IE increases in proportion to the supply voltage VG2 to the second grid G2. On the other hand, the current IB which passes through the aperture AP of the second grid G2 has an extreme value. This is because various conditions which form the crossover image are changed depending on the size of the supply voltage VG2.

When the crossover image P is formed at the location of the aperture AP of the second grid G2 (see the electron beam shown by the solid line) as shown in FIG. 3C, the ratio IB/IE becomes maximum as shown by R2 in FIG. 3B. Accordingly, the area shown by R2 in FIG. 3B covers the best conditions to irradiate the most uniform electron beam. This is the basic setting condition of the four-pole electron gun according to the present invention.

FIG. 4 is a schematic block diagram of an electron beam exposure apparatus using the four-pole electron gun according to one embodiment of the present invention. A −50 kV high voltage unit is provided for generating a negative high voltage, i.e., −50 kV, in order to accelerate the electron beam. This unit includes a −2 kV voltage booster, a +2 kV voltage booster, and a filament rectifier. The +2 kV voltage booster and the filament rectifier are shown in detail in following FIG. 5 as an electrode voltage control unit. Further, a −50 kV voltage booster is provided for boosting the voltage. A power source is provided for the −50 kV high voltage unit and the −50 kV voltage booster.

Figure 5:
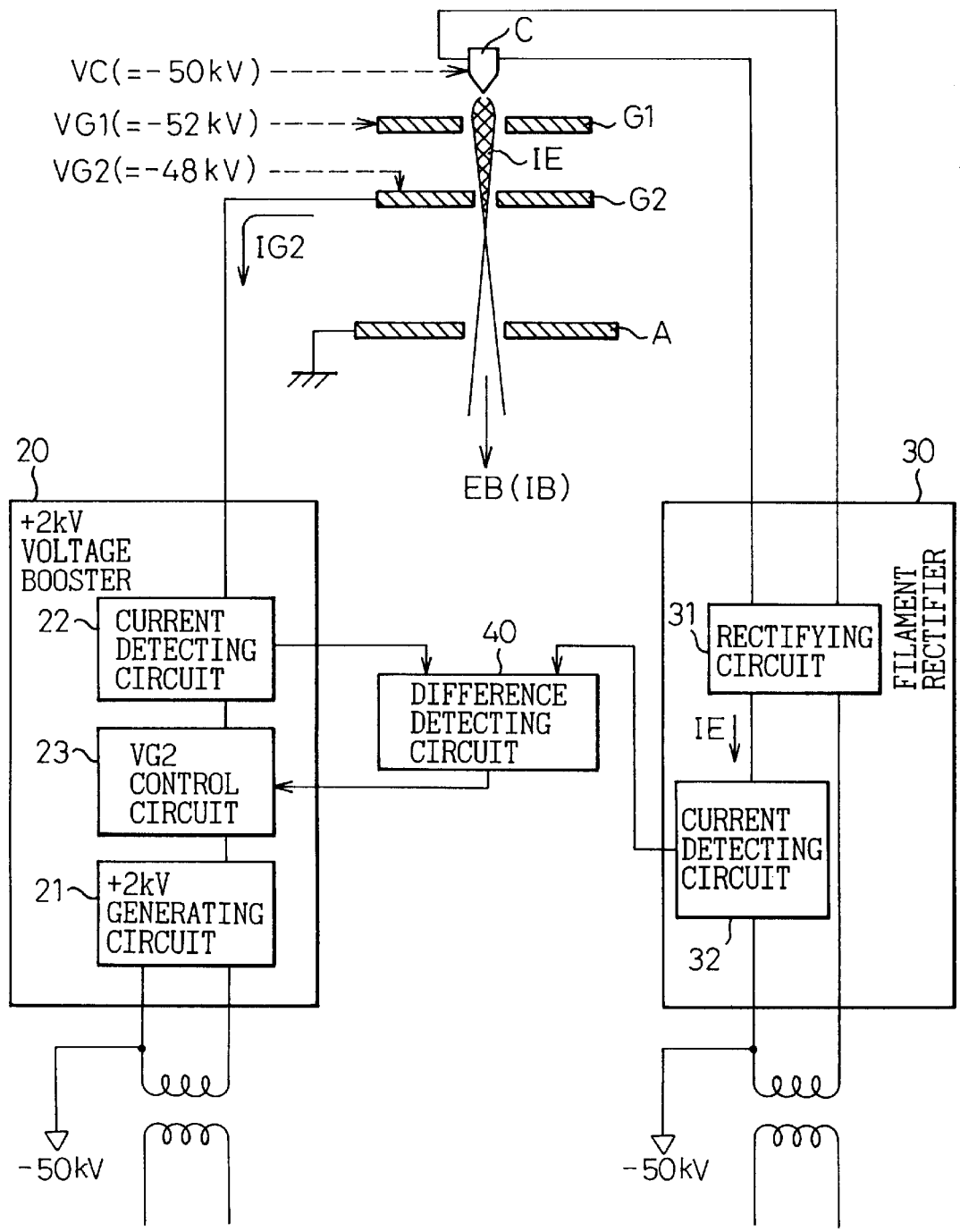
FIG. 5 is a schematic block diagram of an electrode voltage control unit in the four-pole electron gun shown in FIG. 4.

FIG. 5 is a schematic block diagram of an electrode voltage control unit in the four-pole electron gun shown in FIG. 4. The +2 kV voltage booster 20 is provided for supplying the supply voltage VG2 (=−48 kV) to the second grid G2, and the filament rectifier 30 is provided for supplying the supply voltage VC (=−50 kV) to the cathode C. The voltage booster 20 and the filament rectifier 30 are connected to a difference detecting circuit 40. Further, the voltage booster 20 and the filament rectifier 30 are also connected to another booster for generating negative and high-accelerated voltage VC (=−50 kV) to be supplied to the cathode C.

The voltage booster 20 includes a +2 kV generating circuit 21 for adding +2 kV to −50 kV and generating the supply voltage VG2 (=−48 kV), a current detecting circuit 22 for detecting the current IG2 from the second grid G2, and a VG2 control circuit 23 for controlling the supply voltage based on an output from the difference detecting circuit 40.

On the other hand, the filament rectifier 30 includes a rectifier circuit 31 for rectifying the AC voltage (−50 kV) and supplying the rectified voltage to the cathode C, and a current detecting circuit 32 for detecting the emission current IE from the cathode C.

Further, the difference detecting circuit 40 calculates a difference between the current IE detected by the current detecting circuit 32 and the current IG2 detected by the current detecting circuit 22. This difference is output to the VG2 control circuit 23.

As is obvious from the above structure, the current IB which passes through the aperture AP of the second grid G2 is formed by the difference between the emission current IE emitted from the cathode C and the current IG2 from the second grid G2 (i.e., IB=IE−IG2). In this embodiment, the difference detecting circuit 40 detects the current IB, and controls the supply voltage VG2 of the second grid G2 in such a way that the current IB is not changed (i.e., becomes constant) by using the VG2 control circuit 23 based on a result of detection by the circuit 40.

In this case, although the current IB is controlled so as to become constant, it is not limited to the above current IB as an object to be controlled. For example, the emission current IE from the cathode C can be controlled so as to become constant, and the current IG2 from the second grid G2 can be controlled so as to become constant.

Further, in the structure shown in FIG. 5, although the output of the difference detecting circuit 40 is input to the VG2 control circuit 23 in the voltage booster 20, it is not limited to this structure. For example, the output of the difference detecting circuit 40 is input to the voltage booster for the first grid G1, and the supply voltage VG1 for the first grid G1 is controlled so as to become constant.

As explained above, according to the present invention, it is possible to minimize damage at the aperture portion of the patterns formed on the mask and at the area surrounding the rectangular aperture, so that it is possible to easily solve the conventional problems of, for example, melting of the surrounding area.

What is claimed is:

1. An electron gun used in an electron beam exposure apparatus, comprising:

a cathode for emitting an electron beam when supplying a negative and high-accelerated voltage;

a first grid provided downstream of the cathode for focusing a crossover image of the electron beam when supplying a voltage which becomes a reverse bias for the cathode, and the cathode and the first grid being arranged at a high voltage side of a high voltage insulator;

an anode, for collecting the electron beam which passes through the first grid, arranged at a low voltage side of the high voltage insulator; and a second grid, provided at the high voltage side of the high voltage insulator and between the first grid and the anode, having an aperture for limiting an amount of the electron beam passing therethrough;

wherein a voltage which becomes a forward bias for the cathode is supplied to the second grid, and the crossover image is focused at the aperture of the second grid.

2. An electron gun as claimed in claim 1, further comprising an electromagnetic deflector for deflecting the electron beam emitted from the cathode toward the aperture of the second grid, wherein the electro-magnetic deflector is arranged at a location insulated from the cathode and the first/second grids through the high voltage insulator and is arranged at the location approximately corresponding to the location of the cathode for the irradiated direction of the electron beam.

3. An electron gun as claimed in claim 1 or 2, further comprising a difference detecting circuit for calculating a current (IB) passing through the aperture of the second grid based on a difference between an emission current (IE) emitted from the cathode and the current (IG2) inputting to the second grid, and for controlling at least one of supply voltages (VG1, VG2) for the first and second grids (G1, G2) as the calculated current (IB) is kept in constant.

4. An electron gun as claimed in claim 1 or 2, wherein at least one of supply voltages (VG1, VG2) for the first and second grids (G1, G2) is controlled as the emission current (IE) from the cathode is kept constant.

5. An electron gun as claimed in claim 1 or 2, wherein at least one of supply voltages (VG1, VG2) for the first and second grids (G1, G2) is controlled as the current (IG2) inputting to the second grid is kept constant.

6. An electron gun as claimed in claim 1 or 2, wherein each of supply voltages (VG1, VG2) for the first and second grids (G1, G2) is determined as a ratio (IB/IE) of the current passing through the aperture of the second grid and the emission current (IE) emitted from the cathode becomes maximum.

7. An electron gun as claimed in claim 1, wherein the electron gun is formed as a four-pole electron gun.

* * * * *